US012335361B2

(12) United States Patent
Karman

(10) Patent No.: US 12,335,361 B2
(45) Date of Patent: Jun. 17, 2025

(54) DIGITAL PHASE-LOCKED LOOPS

(71) Applicant: Cypress Semiconductor Corporation, San Jose, CA (US)

(72) Inventor: Saleh Karman, Villach (AT)

(73) Assignee: Cypress Semiconductor Corporation, San Jose, CA (US)

( * ) Notice: Subject to any disclaimer, the term of this patent is extended or adjusted under 35 U.S.C. 154(b) by 40 days.

(21) Appl. No.: 18/513,157

(22) Filed: Nov. 17, 2023

(65) Prior Publication Data
US 2025/0167974 A1 May 22, 2025

(51) Int. Cl.
*H04L 7/033* (2006.01)
(52) U.S. Cl.
CPC ..................................... *H04L 7/033* (2013.01)
(58) Field of Classification Search
CPC ... H04L 7/0331; H03L 7/0991; H03L 7/0992; H03L 7/0802; H03L 7/18; G04F 10/005
See application file for complete search history.

(56) References Cited

U.S. PATENT DOCUMENTS

| 10,340,927 | B1 * | 7/2019 | Gambhir | H03L 7/1075 |
| 11,764,802 | B1 * | 9/2023 | Harush | H03M 1/502 331/18 |
| 2019/0058481 | A1 * | 2/2019 | Gao | H03L 7/0992 |
| 2022/0038104 | A1 * | 2/2022 | Lee | H03L 7/099 |
| 2024/0056084 | A1 * | 2/2024 | Lee | H03L 7/093 |

OTHER PUBLICATIONS

F. M. Gardner, Charge-pump phase-lock loops, IEEE T. Communication, COM-28, No. 11, 1849-58, dated Nov. 1980, 10 pages.

* cited by examiner

*Primary Examiner* — Aristocratis Fotakis

(57) ABSTRACT

A digital phase-locked loop includes a first clock divider, a decimation filter, a proportional integral filter, a signal conditioner, and a digitally controlled oscillator. The first clock divider divides a first clock signal including a first clock rate to generate a second clock signal including a second clock rate less than the first clock rate. The decimation filter converts an input signal at the first clock rate to an output signal at the second clock rate. The proportional integral filter filters the output signal at the second clock rate to generate a filtered output signal. The signal conditioner conditions the filtered output signal at the second clock rate to generate a conditioned output signal. The digitally controlled oscillator generates a carrier clock signal in response to the conditioned output signal.

20 Claims, 7 Drawing Sheets

DIGITAL PHASE-LOCKED LOOPS

BACKGROUND

Power consumption is a key parameter of every integrated circuit, especially for battery powered devices. Recently, wireless transceivers for radar, Wi-Fi, Bluetooth, and other wireless radio applications have increasingly relied on digital phase-locked loops (DPLLs) to perform frequency modulation due to their small form factor, highly reconfigurable nature, and scalability at different technology nodes. DPLLs rely heavily on background calibrations to achieve a target performance that can lead to high power consumption depending on the specific application.

For these and other reasons, a need exists for the present invention.

SUMMARY

Some examples of the present disclosure relate to a digital phase-locked loop. The digital phase-locked loop includes a first clock divider, a decimation filter, a proportional integral filter, a signal conditioner, and a digitally controlled oscillator. The first clock divider divides a first clock signal including a first clock rate to generate a second clock signal including a second clock rate less than the first clock rate. The decimation filter converts an input signal at the first clock rate to an output signal at the second clock rate. The proportional integral filter filters the output signal at the second clock rate to generate a filtered output signal. The signal conditioner conditions the filtered output signal at the second clock rate to generate a conditioned output signal. The digitally controlled oscillator generates a carrier clock signal in response to the conditioned output signal.

Other examples of the present disclosure relate to a system. The system includes a controller, a transceiver, and at least one antenna electrically coupled to the transceiver. The transceiver is communicatively coupled to the controller and includes a digital phase-locked loop. The digital phase-locked loop includes a first clock divider, a decimation filter, a proportional integral filter, a signal conditioner, and a digitally controlled oscillator. The first clock divider divides a first clock signal including a first clock rate to generate a second clock signal including a second clock rate less than the first clock rate. The decimation filter converts an input signal at the first clock rate to an output signal at the second clock rate. The proportional integral filter filters the output signal at the second clock rate to generate a filtered output signal. The signal conditioner conditions the filtered output signal at the second clock rate to generate a conditioned output signal. The digitally controlled oscillator generates a carrier clock signal in response to the conditioned output signal.

Yet other examples of the present disclosure relate to a method. The method includes dividing a first clock signal including a first clock rate to generate a second clock signal including a second clock rate less than the first clock rate. The method includes converting, via a decimation filter, an input signal at the first clock rate to an output signal at the second clock rate. The method includes filtering, via a proportional integral filter, the output signal at the second clock rate to generate a filtered output signal. The method includes conditioning the filtered output signal at the second clock rate to generate a conditioned output signal. The method includes generating, via a digitally controlled oscillator, a carrier clock signal in response to the conditioned output signal.

DETAILED DESCRIPTION

In the following detailed description, reference is made to the accompanying drawings which form a part hereof, and in which is shown by way of illustration specific examples in which the disclosure may be practiced. It is to be understood that other examples may be utilized, and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

The reference frequency of a digital phase-locked loop (DPLL) is usually defined according to system level specifications, which, for example, can require the reference spur to fall at a specific frequency, the bandwidth of the DPLL to have a specific width, or the in-band noise to have a specific level (e.g., higher clock frequencies allow for lower noise). For proper circuit operation, the ratio between the reference frequency $f_{ref}$ and the DPLL bandwidth $BW_{PLL}$ should be $f_{ref}/BW_{PLL}>=10$ for the continuous-time approximation of the DPLL to work well, which is commonly known as Gardner's limit. In practical implementations, this factor can exceed 100, a value much higher than the value required for proper operation of the DPLL. The same clock frequency is then used to clock all the digital logic processing the data, since the phase-detector throughput is at $f_{ref}$, which may result in high power consumption.

Thus, disclosed herein are devices, systems, and methods to reduce the clock frequency of a portion of the digital circuitry of DPLLs while preserving performance of the system. For example, the power consumption of DPLL based frequency modulators may be reduced by reducing the clock frequency of the digital circuitry associated with a loop filter and a signal conditioner of the DPLL while preserving the performance of the system.

Figure 1A:
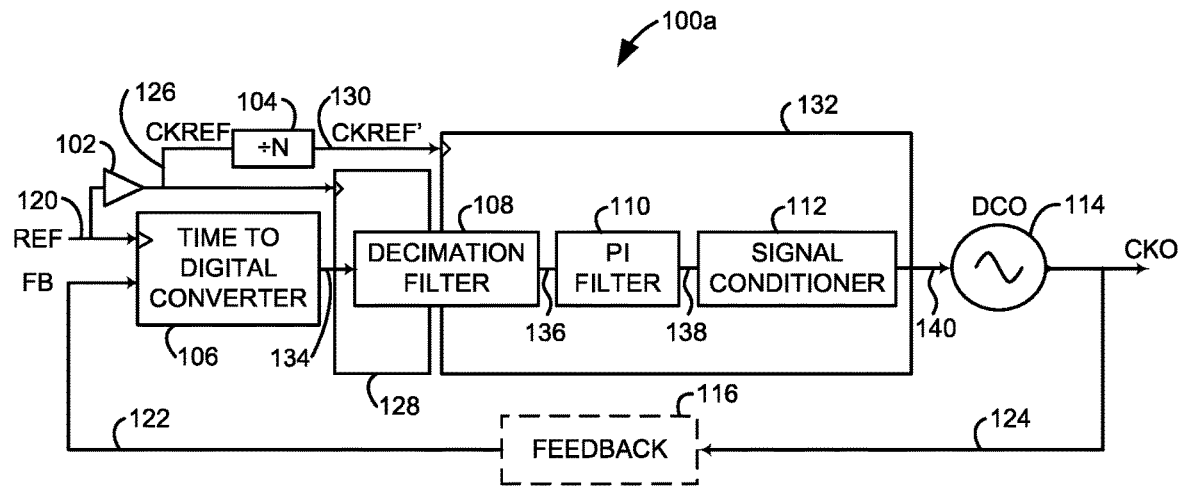
FIGS. 1A and 1B are schematic diagrams illustrating example digital phase-locked loops.

FIG. 1A is a schematic diagram illustrating an example digital phase-locked loop (DPLL) 100a. DPLL 100a may include a feedback divider DPLL architecture, a phase-domain DPLL architecture, a sub-sampling DPLL architecture, or another suitable DPLL architecture. DPLL 100a includes a buffer 102, a clock divider 104, a time to digital converter 106, a decimation filter 108, a proportional integral (PI) filter 110, a signal conditioner 112, and a digitally controlled oscillator (DCO) 114. In some examples, DPLL 100a may further include feedback circuit 116. DPLL 100a also includes first digital circuitry 128 including at least a first portion (e.g., input portion) of decimation filter 108. DPLL 100a also includes second digital circuitry 132 including at least a second portion (e.g., output portion) of decimation filter 108 and PI filter 110 and signal conditioner 112.

A first input to time to digital converter 106 and the input of buffer 102 receive a reference signal (REF) on a signal path 120. In some examples, a second input of time to digital converter 106 is electrically coupled to the output of feedback circuit 116 through a feedback signal (FB) path 122, and the input of feedback circuit 116 is electrically coupled to the output of DCO 114 through a carrier clock signal (CKO) path 124. In other examples, feedback circuit 116 is excluded such that the second input of time to digital converter 106 is directly electrically coupled to the output of DCO 114 through CKO signal path 124 and FB signal path 122.

The output of buffer 102 is electrically coupled to the input of clock divider 104 and the clock input of first digital circuitry 128 through a first clock signal (CKREF) path 126. The output of clock divider 104 is electrically coupled to the clock input of second digital circuitry 132 through a second clock signal (CKREF') path 130. The output of time to digital converter 106 is electrically coupled to the input of decimation filter 108 through an input signal path 134. The output of decimation filter 108 is electrically coupled to the input of PI filter 110 through an output signal path 136. The output of PI filter 110 is electrically coupled to the input of signal conditioner 112 through a filtered output signal path 138. The output of signal conditioner 112 is electrically coupled to the input of DCO 114 through a conditioned output signal path 140.

The reference signal on REF signal path 120 may be a clock signal output from a clock generator (e.g., a crystal oscillator circuit). Buffer 102 buffers the reference signal (REF) to generate the first clock signal (CKREF). Clock divider 104 divides the first clock signal (CKREF) including a first clock rate (or first clock frequency) to generate the second clock signal (CKREF') including a second clock rate (or second clock frequency) less than the first clock rate. For example, clock divider 104 may divide the first clock signal by a factor of N to generate the second clock signal, where N is within a range, for example, between 2 and 4. In one example, N equals 2 such that the second clock rate is one half the first clock rate. The first digital circuitry 128 is clocked by the first clock signal (CKREF) at the first clock rate, while the second digital circuitry 132 is clocked by the second clock signal (CKREF') at the second clock rate. By clocking the second digital circuitry 132 at the second clock rate rather than at the first clock rate, the power consumption of DPLL 100a is significantly reduced without reducing the performance of the DPLL.

Time to digital converter 106 compares the phase of the reference signal (REF) to the phase of the feedback signal (FB) to generate an error signal proportional to the time error between the reference signal and the feedback signal. The feedback signal is based on the carrier clock signal (CKO) on carrier clock signal path 124 (e.g., either directly or as processed by feedback circuit 116). The error signal generated by time to digital converter 106 provides the input signal to decimation filter 108 on input signal path 134. Decimation filter 108 converts the input signal at the first clock rate to an output signal at the second clock rate. Decimation filter 108 acts as a loop filter (e.g., infinite impulse response (IIR) filter) and lowers the output rate of the output signal by the factor of N, which is the same factor used by clock divider 104. Decimation filter 108 may include a cascaded integrator comb (CIC) filter, a polyphase filter, or another suitable architecture for converting the input signal at the first clock rate to an output signal at the second clock rate. By converting the input signal at the first clock rate to an output signal at the second clock rate, PI filter 110 and signal conditioner 112 may be clocked by the second clock signal to process the output signal from decimation filter 108 at the lower second clock rate, thereby reducing power consumption of DPLL 100a.

PI filter 110 filters the output signal from decimation filter 108 at the second clock rate to generate a filtered output signal. PI filter 110 may filter out noise of the output signal from decimation filter 108 to generate the filtered output signal passed to signal conditioner 112. Signal conditioner 112 conditions the filtered output signal from PI filter 110 at the second clock rate to generate a conditioned output signal. In some examples, signal conditioner 112 may include predistortion and calibration circuitry, gain normalization circuitry, a delta-sigma modulator, and/or other suitable signal conditioning circuitry. DCO 114 generates the carrier clock signal (CKO) at a desired frequency in response to the conditioned output signal from signal conditioner 112.

Figure 1B:
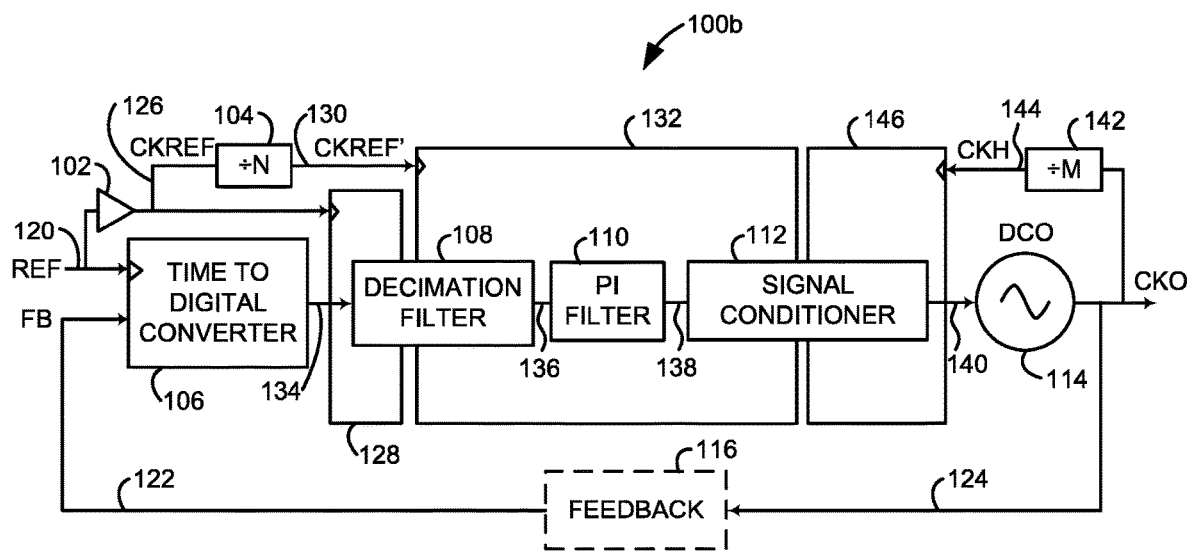

FIG. 1B is a schematic diagram illustrating another example digital phase-locked loop (DPLL) 100b. DPLL 100b may include a feedback divider DPLL architecture, a phase-domain DPLL architecture, a sub-sampling DPLL architecture, or another suitable DPLL architecture. DPLL 100b is similar to DPLL 100a previously described and illustrated with reference to FIG. 1A, except that DPLL 100b further includes a second clock divider 142 and third digital circuitry 146. In DPLL 100b, second digital circuitry 132 includes at least a first portion (e.g., input portion) of signal conditioner 112 and third digital circuitry 146 includes at least a second portion (e.g., output portion) of signal conditioner 112. The input of clock divider 142 is electrically coupled to the output of DCO 114 through carrier clock signal (CKO) path 124. The output of clock divider 142 is electrically coupled to the clock input of third digital circuitry 146 through a third clock signal (CKH) path 144.

Clock divider 142 divides the carrier clock signal (CKO) to generate a third clock signal (CKH) including a third clock rate greater than the second clock rate. For example, clock divider 142 may divide the carrier clock signal by a factor of M to generate the third clock signal, where M is within a range, for example, between 2 and 4. The third digital circuitry 146 is clocked by the third clock signal (CKH) at the third clock rate, such that the first portion of signal conditioner 112 conditions the filtered output signal from PI filter 110 at the second clock rate to generate an intermediate output signal, and the second portion of the signal conditioner 112 conditions the intermediate output signal at the third clock rate to generate the conditioned output signal driving DCO 114. By clocking the third digital circuitry 146 at the third clock rate rather than at the second clock rate, quantization noise of the conditioned output signal driving DCO 114 may be pushed to a higher frequency.

Figure 2A:
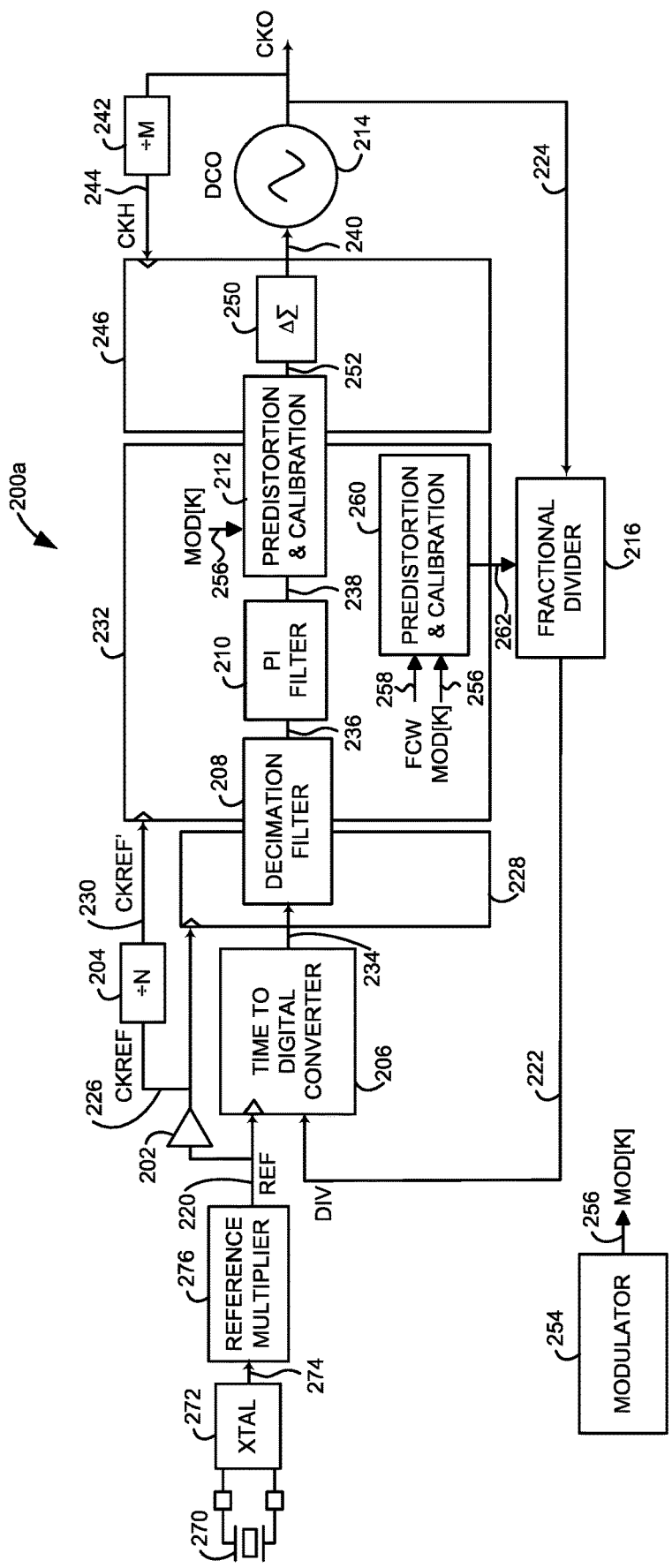
FIGS. 2A and 2B are schematic diagrams illustrating other example digital phase-locked loops.

FIG. 2A is a schematic diagram illustrating an example digital phase-locked loop (DPLL) 200a. DPLL 200a includes a buffer 202, a first clock divider 204, a time to digital converter 206, a decimation filter 208, a proportional integral (PI) filter 210, a signal conditioner including first predistortion and calibration circuitry 212 and a delta-sigma modulator 250, a digitally controlled oscillator (DCO) 214, a second clock divider 242, second predistortion and calibration circuitry 260, a fractional divider 216, a modulator 254, and a clock generation circuit including a crystal 270, a crystal oscillator circuit (XTAL) 272, and a reference multiplier 276. DPLL 200a also includes first digital circuitry 228 including at least a first portion (e.g., input portion) of decimation filter 208. DPLL 200a also includes second digital circuitry 232 including at least a second portion (e.g., output portion) of decimation filter 208 and PI filter 210 and at least a first portion (e.g., input portion) of first predistortion and calibration circuitry 212. In some examples, second digital circuitry 232 may include all of first predistortion and calibration circuitry 212. DPLL 200a also includes third digital circuitry 246 including delta-signal modulator 250. In some examples, third digital circuitry 246 may include at least a second portion (e.g., output portion) of first predistortion and calibration circuitry 212.

Crystal 270 is electrically coupled to the input of crystal oscillator circuit 272. The output of crystal oscillator circuit 272 is electrically coupled to the input of reference multiplier 276 through a crystal oscillator output signal path 274. The output of reference multiplier 276 is electrically coupled to a first input of time to digital converter 206 and the input of buffer 202 through a reference signal (REF) path 220. A second input of time to digital converter 206 is electrically coupled to the output of fractional divider 216 through a feedback signal (DIV) path 222, and the input of fractional divider 216 is electrically coupled to the output of DCO 214 through a carrier clock signal (CKO) path 224.

The output of buffer 202 is electrically coupled to the input of first clock divider 204 and the clock input of first digital circuitry 228 through a first clock signal (CKREF) path 226. The output of clock divider 204 is electrically coupled to the clock input of second digital circuitry 232 through a second clock signal (CKREF') path 230. The output of time to digital converter 206 is electrically coupled to the input of decimation filter 208 through an input signal path 234. The output of decimation filter 208 is electrically coupled to the input of PI filter 210 through an output signal path 236. The output of PI filter 210 is electrically coupled to the input of first predistortion and calibration circuitry 212 through a filtered output signal path 238. The output of first predistortion and calibration circuitry 212 is electrically coupled to an input of delta-sigma modulator 250 through an intermediate signal path 252. The output of delta-sigma modulator 250 is electrically coupled to the input of DCO 214 through a conditioned output signal path 240. The output of DCO 214 is electrically coupled to the input of second clock divider 242 through carrier clock signal (CKO) path 224. The output of second clock divider 242 is electrically coupled to the clock input of third digital circuitry 246 through a third clock signal (CKH) path 244.

The output of modulator 254 is electrically coupled to a control input of first predistortion and calibration circuitry 212 and a first control input of second predistortion and calibration circuitry 260 through a modulation signal (MOD [K]) path 256. A second control input of second predistortion and calibration circuitry 260 receives a frequency control word (FCW) signal on signal path 258. The output of second predistortion and calibration circuitry 260 is electrically coupled to an input of fractional divider 216 through a signal path 262.

Crystal oscillator circuit 272 generates a reference oscillator signal in response to a signal from crystal 270. Reference multiplier 276 multiplies the reference oscillator signal frequency by a reference multiplier to generate the reference signal (REF) having a desired frequency (e.g., the first clock rate).

Buffer 202 buffers the reference signal (REF) to generate the first clock signal (CKREF). Clock divider 204 divides the first clock signal (CKREF) including a first clock rate (or first clock frequency) to generate the second clock signal (CKREF') including a second clock rate (or second clock frequency) less than the first clock rate. For example, clock divider 204 may divide the first clock signal by a factor of N to generate the second clock signal, where N is within a range, for example, between 2 and 4. In one example, N equals 2 such that the second clock rate is one half the first clock rate. The first digital circuitry 228 is clocked by the first clock signal (CKREF) at the first clock rate, while the second digital circuitry 232 is clocked by the second clock signal (CKREF') at the second clock rate. By clocking the second digital circuitry 232 at the second clock rate rather than at the first clock rate, the power consumption of DPLL 200a is significantly reduced without reducing the performance of the DPLL.

Second clock divider 242 divides the carrier clock signal (CKO) to generate a third clock signal including a third clock rate greater than the second clock rate. For example, clock divider 242 may divide the carrier clock signal by a factor of M to generate the third clock signal, where M is within a range, for example, between 2 and 4. The third digital circuitry 246 is clocked by the third clock signal (CKH) at the third clock rate. By clocking the third digital circuitry 246 at the third clock rate rather than at the second clock rate, quantization noise of delta-sigma modulator 250 driving DCO 214 may be pushed to a higher frequency.

Time to digital converter 206 compares the phase of the reference signal (REF) to the phase of the feedback signal (DIV) to generate an error signal proportional to the time error between the reference signal and the feedback signal. The feedback signal is based on a carrier clock signal (CKO) on carrier clock signal path 224 divided by fractional divider 216. The error signal generated by time to digital converter 206 provides the input signal to decimation filter 208 on input signal path 234. Decimation filter 208 converts the input signal at the first clock rate to an output signal at the second clock rate. Decimation filter 208 acts as a loop filter (e.g., infinite impulse response (IIR) filter) and lowers the output rate of the output signal by the factor of N, which is the same factor used by first clock divider 204. Decimation filter 208 may include a cascaded integrator comb (CIC) filter, a polyphase filter, or another suitable architecture for converting the input signal at the first clock rate to an output signal at the second clock rate. By converting the input signal at the first clock rate to an output signal at the second clock rate, PI filter 210, at least the first portion of first predistortion and calibration circuitry 212, and second predistortion and calibration circuitry 260 may be clocked by the second clock signal to process the output signal from decimation filter 208 at the lower second clock rate, thereby reducing power consumption of DPLL 200a.

PI filter 210 filters the output signal from decimation filter 208 at the second clock rate to generate a filtered output signal. PI filter 210 may filter out noise of the output signal from decimation filter 208 to generate the filtered output signal passed to first predistortion and calibration circuitry 212. At least a first portion of first predistortion and calibration circuitry 212 conditions the filtered output signal from PI filter 210 at the second clock rate and a second portion of the first predistortion and calibration circuitry 212 may further condition the filtered output signal at the second clock rate or the third clock rate to generate an intermediate signal. First predistortion and calibration circuitry 212 and second predistortion and calibration circuitry 260 may rely on look up tables (LUT) or least mean squares (LMS) algorithms running in the background, or both, to precisely define the gain and linearity of DCO 214. Delta-sigma modulator 250 generates the conditioned output signal based on the intermediate signal from first predistortion and calibration circuitry 212 at the third clock rate. First predistortion and calibration circuitry 212 and delta-sigma modulator 250 may compensate for non-linearities of DCO 214. DCO 214 generates the carrier clock signal (CKO) at a desired frequency in response to the conditioned output signal from delta-sigma modulator 250.

Fractional divider 216 receives the carrier clock signal to generate the feedback signal (DIV) to compensate for the fractional delay between signal paths. DPLL 200a may be used as a frequency modulator, thus modulator 254 may generate a modulation signal (MOD[K]), which is passed as a control signal to the first predistortion and calibration circuitry 212 driving the delta-sigma modulator 250 and to the second predistortion and calibration circuitry 260 driving the fractional divider 216.

Figure 2B:
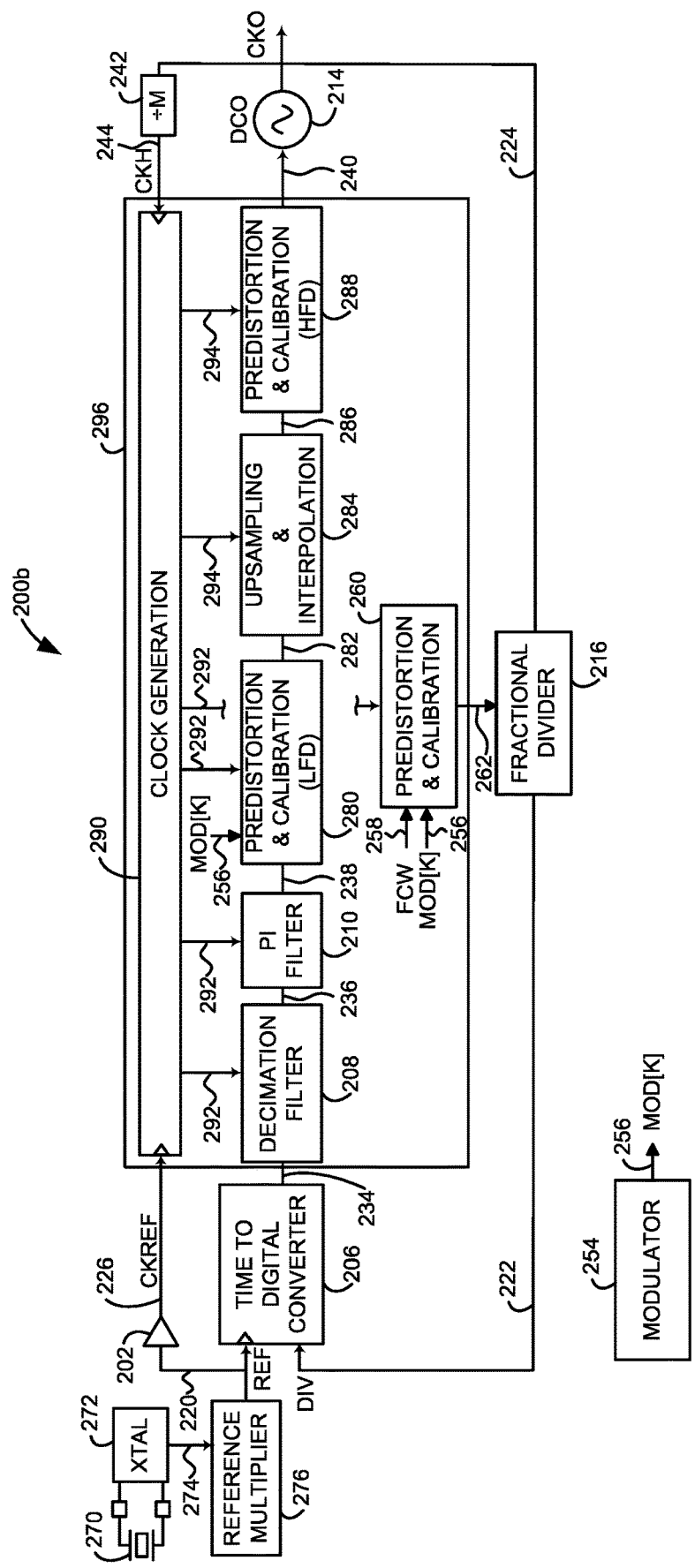

FIG. 2B is a schematic diagram illustrating an example digital phase-locked loop (DPLL) 200b. DPLL 200b includes a buffer 202, a time to digital converter 206, a decimation filter 208, a proportional integral (PI) filter 210, a signal conditioner including low frequency domain (LFD) predistortion and calibration circuitry 280, upsampling and interpolation circuitry 284, and high frequency domain (HFD) predistortion and calibration circuitry 288, a digitally controlled oscillator (DCO) 214, clock generation circuitry 290, a clock divider 242, second predistortion and calibration circuitry 260, a fractional divider 216, a modulator 254, and a clock generation circuit including a crystal 270, a crystal oscillator circuit (XTAL) 272, and a reference multiplier 276. DPLL 200b also includes digital circuitry 296 including decimation filter 208, PI filter 210, LFD predistortion and calibration circuitry 280, upsampling and interpolation circuitry 284, HFD predistortion and calibration circuitry 288, second predistortion and calibration circuitry 260, and clock generation circuitry 290.

Crystal 270 is electrically coupled to the input of crystal oscillator circuit 272. The output of crystal oscillator circuit 272 is electrically coupled to the input of reference multiplier 276 through a crystal oscillator output signal path 274. The output of reference multiplier 276 is electrically coupled to a first input of time to digital converter 206 and the input of buffer 202 through a reference signal (REF) path 220. A second input of time to digital converter 206 is electrically coupled to the output of fractional divider 216 through a feedback signal (DIV) path 222, and the input of fractional divider 216 is electrically coupled to the output of DCO 214 through a carrier clock signal (CKO) path 224.

The output of buffer 202 is electrically coupled to a first clock input of clock generation circuitry 290 through a first clock signal (CKREF) path 226. The output of time to digital converter 206 is electrically coupled to the input of decimation filter 208 through an input signal path 234. The output of decimation filter 208 is electrically coupled to the input of PI filter 210 through an output signal path 236. The output of PI filter 210 is electrically coupled to the input of LFD predistortion and calibration circuitry 280 through a filtered output signal path 238. The output of LFD predistortion and calibration circuitry 280 is electrically coupled to the input of upsampling and interpolation circuitry 284 through a first intermediate signal path 282. The output of upsampling and interpolation circuitry 284 is electrically coupled to the input of HFD predistortion and calibration circuitry 288 through a second intermediate signal path 286. The output of HFD predistortion and calibration circuitry 288 is electrically coupled to the input of DCO 214 through a conditioned output signal path 240.

The output of DCO 214 is electrically coupled to the input of clock divider 242 through carrier clock signal (CKO) path 224. The output of clock divider 242 is electrically coupled to a second clock input of clock generation circuitry 290 through a third clock signal (CKH) path 244. First outputs of clock generation circuitry 290 are electrically coupled to clock inputs of decimation filter 208, PI filter 210, LFD predistortion and calibration circuitry 280, and second predistortion and calibration circuitry 260 through clock signal paths 292. Second outputs of clock generation circuitry 290 are electrically coupled to clock inputs of upsampling and interpolation circuitry 284 and HFD predistortion and calibration circuitry 288 through clock signal paths 294.

The output of modulator 254 is electrically coupled to a control input of LFD predistortion and calibration circuitry 280 and a first control input of second predistortion and calibration circuitry 260 through a modulation signal (MOD [K]) path 256. A second control input of second predistortion and calibration circuitry 260 receives a frequency control word (FCW) signal on signal path 258. The output of second predistortion and calibration circuitry 260 is electrically coupled to an input of fractional divider 216 through a signal path 262.

As previously described, crystal oscillator circuit 272 generates a reference oscillator signal in response to a signal from crystal 270. Reference multiplier 276 multiplies the reference oscillator signal frequency by a reference multiplier to generate the reference signal (REF) having a desired frequency (e.g., the first clock rate).

Buffer 202 buffers the reference signal (REF) to generate the first clock signal (CKREF). Clock generation circuitry 290 may divide the first clock signal (CKREF) including a first clock rate (or first clock frequency) to generate the second clock signal including a second clock rate (or second clock frequency) less than the first clock rate. The second clock signal may be used to clock decimation filter 208, PI filter 210, LFD predistortion and calibration circuitry 280, and second predistortion and calibration circuitry 260 through clock signal paths 292. By clocking decimation filter 208, PI filter 210, LFD predistortion and calibration circuitry 280, and second predistortion and calibration circuitry 260 at the second clock rate rather than at the first clock rate, the power consumption of DPLL 200b is significantly reduced without reducing the performance of the DPLL.

Second clock divider 242 divides the carrier clock signal (CKO) to generate a third clock signal (CKH) including a third clock rate greater than the second clock rate. Clock generation circuitry 290 may further divide or pass the third clock signal (CKH) to generate a fourth clock signal having a fourth clock rate greater than the second clock rate. The fourth clock signal may be used to clock upsampling and interpolation circuitry 284 and HFD predistortion and calibration circuitry 288 through clock signal paths 294. By clocking upsampling and interpolation circuitry 284 and HFD predistortion and calibration circuitry 288 at the fourth clock rate rather than at the second clock rate, quantization noise of upsampling and interpolation circuitry 284 and/or HFD predistortion and calibration circuitry 288 driving DCO 214 may be pushed to a higher frequency.

Time to digital converter 206 compares the phase of the reference signal (REF) to the phase of the feedback signal (DIV) to generate an error signal proportional to the time error between the reference signal and the feedback signal. The feedback signal is based on a carrier clock signal (CKO)

on carrier clock signal path 224 divided by fractional divider 216. The error signal generated by time to digital converter 206 provides the input signal to decimation filter 208 on input signal path 234. Decimation filter 208 converts the input signal at the first clock rate to an output signal at the second clock rate. Decimation filter 208 acts as a loop filter (e.g., infinite impulse response (IIR) filter) and lowers the output rate of the output signal by a selected factor. Decimation filter 208 may include a cascaded integrator comb (CIC) filter, a polyphase filter, or another suitable architecture for converting the input signal at the first clock rate to an output signal at the second clock rate. By converting the input signal at the first clock rate to an output signal at the second clock rate, PI filter 210 and LFD predistortion and calibration circuitry 280 may be clocked by the second clock signal to process the output signal from decimation filter 208 at the lower second clock rate, thereby reducing power consumption of DPLL 200b.

PI filter 210 filters the output signal from decimation filter 208 at the second clock rate to generate a filtered output signal. PI filter 210 may filter out noise of the output signal from decimation filter 208 to generate the filtered output signal passed to LFD predistortion and calibration circuitry 280. LFD predistortion and calibration circuitry 280 conditions the filtered output signal from PI filter 210 at the second clock rate to generate a first intermediate signal. Upsampling and interpolation circuitry 284 upsamples and interpolates the first intermediate signal from LFD predistortion and calibration circuitry 280 at the fourth clock rate to generate a second intermediate signal. HFD predistortion and calibration circuitry 288 generates the conditioned output signal based on the second intermediate signal from upsampling and interpolation circuitry 284 at the fourth clock rate. LFD predistortion and calibration circuitry 280, upsampling and interpolation circuitry 284, and HFD predistortion and calibration circuitry 288 may compensate for non-linearities of DCO 214. DCO 214 generates the carrier clock signal (CKO) at a desired frequency in response to the conditioned output signal from HFD predistortion and calibration circuitry 288.

Fractional divider 216 receives the carrier clock signal (CKO) to generate the feedback signal (DIV) to compensate for the fractional delay between signal paths. DPLL 200b may be used as a frequency modulator, thus modulator 254 may generate a modulation signal (MOD[K]), which is passed as a control signal to the LFD predistortion and calibration circuitry 280 driving the upsampling and interpolation circuitry 284 and to the second predistortion and calibration circuitry 260 driving the fractional divider 216.

Figure 3A:
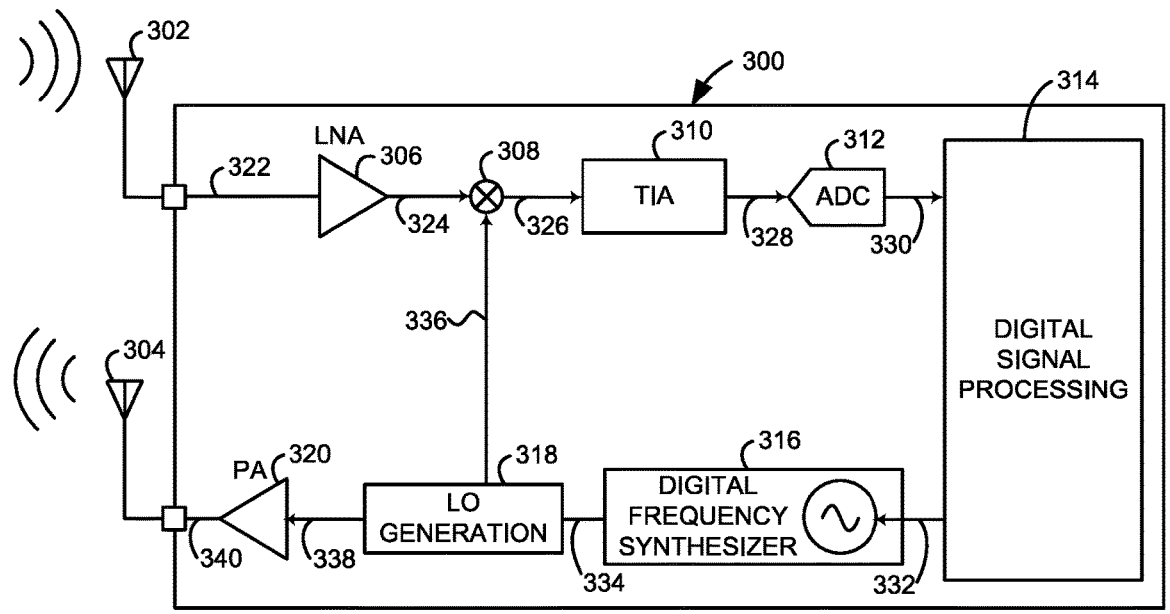
FIGS. 3A and 3B are schematic diagrams illustrating example transceivers.

FIG. 3A is a schematic diagram illustrating an example radio detection and ranging (radar) transceiver 300. Radar transceiver 300 includes a first antenna 302 (e.g., receive antenna), a second antenna 304 (e.g., transmit antenna), a low-noise amplifier (LNA) 306, a mixer 308, a transimpedance amplifier (TIA) 310, an analog to digital converter (ADC) 312, digital signal processing circuitry 314, a digital frequency synthesizer 316, a local oscillator (LO) generation circuit 318, and a power amplifier (PA) 320. First antenna 302 is electrically coupled to the input of LNA 306 through a signal path 322. The output of LNA 306 is electrically coupled to a first input of mixer 308 through a signal path 324. The output of mixer 308 is electrically coupled to the input of TIA 310 through a signal path 326. The output of TIA 310 is electrically coupled to the input of ADC 312 through a signal path 328. The output of ADC 312 is electrically coupled to an input of digital signal processing circuitry 314 through a signal path 330. An output of digital signal processing circuitry 314 is electrically coupled to an input of digital frequency synthesizer 316 through a signal path 332. The output of digital frequency synthesizer 316 is electrically coupled to the input of LO generation circuit 318 through a signal path 334. A first output of LO generation circuit 318 is electrically coupled to a second input of mixer 308 through a signal path 336. A second output of LO generation circuit 318 is electrically coupled to the input of PA 320 through a signal path 338. The output of PA 320 is electrically coupled to second antenna 340 through a signal path 340.

In some examples, digital frequency synthesizer 316 includes DPLL 200a of FIG. 2A or DPLL 200b of FIG. 2B. Therefore, radar transceiver 300 has reduced power consumption compared to radar transceivers that do not include a DPLL as described herein.

First antenna 302 receives a reflected signal in response to a signal transmitted by second antenna 304. LNA 306 amplifies the received signal and passes the amplified signal to mixer 308. Mixer 308 mixes the amplified signal from LNA 306 with a local oscillator signal from LO generation circuit 318 to generate a mixed signal input to TIA 310. TIA 310 converts the mixed signal from mixer 308 to a voltage signal. ADC 312 converts the voltage signal from TIA 310 into a digital signal for digital signal processing circuitry 314. Digital signal processing circuitry 314 may process (e.g., interpret) the digital signal from ADC 312 and drive digital frequency synthesizer 316. Digital frequency synthesizer 316 including DPLL 200a of FIG. 2A or DPLL 200b of FIG. 2B drives LO generation circuit 318 and PA 320, which has a constant envelope, to perform direct frequency synthesis to generate the signal transmitted by second antenna 304.

Figure 3B:
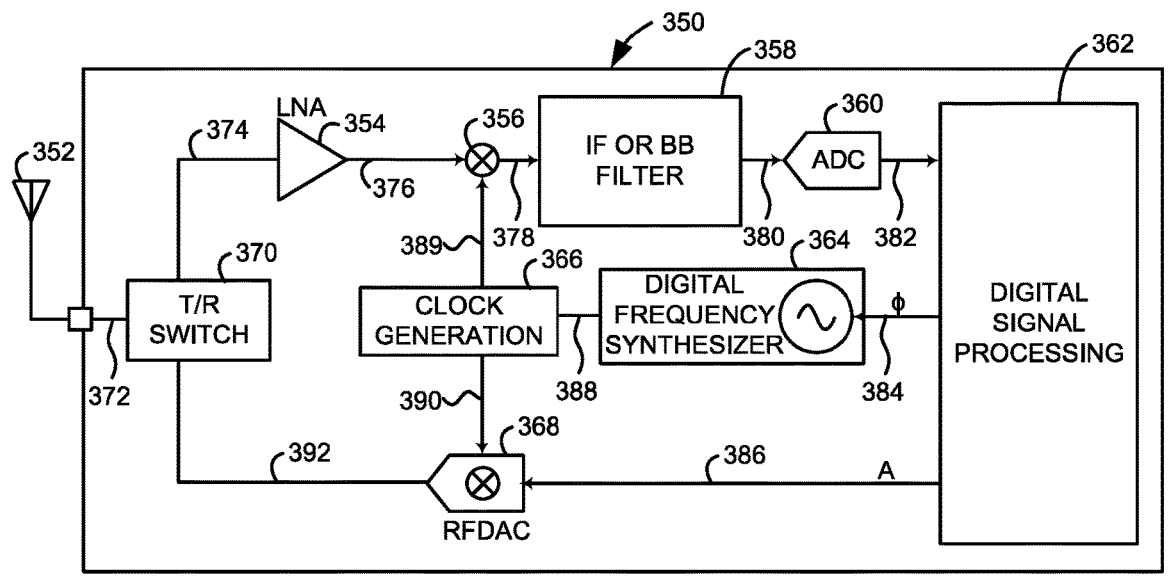

FIG. 3B is a schematic diagram illustrating an example Wi-Fi or Bluetooth transceiver 350. Transceiver 350 includes an antenna 352, a low-noise amplifier (LNA) 354, a mixer 356, an intermediate frequency (IF) or baseband (BB) filter 358 (e.g., depending on the architecture), an analog to digital converter (ADC) 360, digital signal processing circuitry 362, a digital frequency synthesizer 364, a clock generation circuit 366, a radio frequency digital to analog converter (RFDAC) 368, and a transmit/receive (T/R) switch 370. Antenna 352 is electrically coupled to T/R switch 370 through a signal path 372. An output of T/R switch 370 is electrically coupled to the input of LNA 354 through a signal path 374. The output of LNA 354 is electrically coupled to a first input of mixer 356 through a signal path 376. The output of mixer 356 is electrically coupled to the input of IF or BB filter 358 through a signal path 378. The output of IF or BB filter 358 is electrically coupled to the input of ADC 360 through a signal path 380. The output of ADC 360 is electrically coupled to an input of digital signal processing circuitry 362 through a signal path 382. A first output of digital signal processing circuitry 362 is electrically coupled to the input of digital frequency synthesizer 364 through a phase signal (φ) path 384, and a second output of digital signal processing circuitry 362 is electrically coupled to an input of RFDAC 368 through an amplitude signal (A) path 386. The output of digital frequency synthesizer 364 is electrically coupled to the input of clock generation circuit 366 through a signal path 388. A first output of clock generation circuit 366 is electrically coupled to a second input of mixer 356 through a signal path 389. A second output of clock generation circuit 366 is electrically coupled to an input of RFDAC 368 through a signal path 390. The output of RFDAC 368 is electrically coupled to the input of T/R switch 370 through a signal path 392.

Antenna 352 transmits and receives radio frequency (RF) communication signals. T/R switch 370 passes communication signals received by antenna 352 to LNA 354 and passes communication signals to be transmitted from RFDAC 368 to antenna 352. LNA 354 amplifies the received communication signal and passes the amplified communication signal to mixer 356. Mixer 356 mixes the amplified communication signal from LNA 354 with a clock signal generated by clock generation circuit 366 to generate a mixed signal input to IF or BB filter 358. IF or BB filter 358 filters the mixed signal from mixer 356 to generate a filtered signal. ADC 360 converts the filtered signal from IF or BB filter 358 into a digital signal for digital signal processing circuitry 362. Digital signal processing circuitry 362 may process (e.g., interpret) the digital signal from ADC 360 and drive digital frequency synthesizer 364 and RFDAC 368. Digital signal processing circuitry 362 generates a modulation signal split into a phase signal ($\phi$), which is passed to digital frequency synthesizer 364 and an amplitude signal (A), which is passed to RFDAC 368. The phase signal ($\phi$) provides the mod[k] signal to DPLL 200a of FIG. 2A or DPLL 200b of FIG. 2B, which is included within digital frequency synthesizer 364. Based on the phase signal ($\phi$), the DPLL performs phase/frequency modulation. Based on the amplitude signal (A), RFDAC 368 performs amplitude modulation that is clocked by the modulated signal to reconstruct the RF output, which is transmitted by antenna 352.

Figure 4:
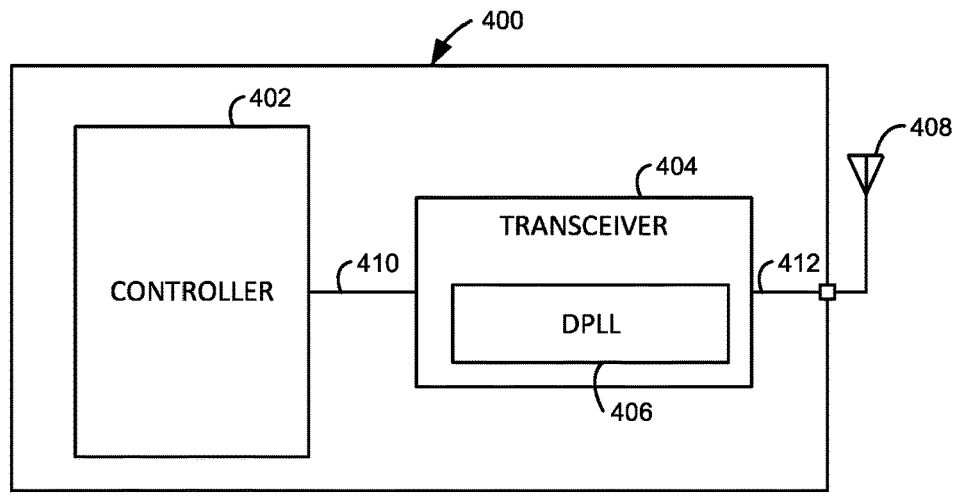
FIG. 4 is a schematic diagram illustrating an example system including a digital phase-locked loop.

FIG. 4 is a schematic diagram illustrating an example system 400. System 400 includes a controller 402, a transceiver 404, and at least one antenna 408. Transceiver 404 includes a digital phase-locked loop (DPLL) 406. Controller 402 is communicatively coupled to transceiver 404 through a communication path 410. Transceiver 404 is electrically coupled to the at least one antenna 408 through a signal path 412. Controller 402 may include a central processing unit (CPU), an application specific integrated circuit (ASIC), a microcontroller, or other suitable logic circuitry for controlling the operation of system 400 including transceiver 404. In some examples, transceiver 404 may be radar transceiver 300 as previously described and illustrated with reference to FIG. 3A, a Wi-Fi or Bluetooth transceiver 350 as previously described and illustrated with reference to FIG. 3B, or another suitable transceiver. In some examples, DPLL 406 may include DPLL 100a of FIG. 1A, DPLL 100b of FIG. 1B, DPLL 200a of FIG. 2A, or DPLL 200b of FIG. 2B as previously described.

Figure 5A:
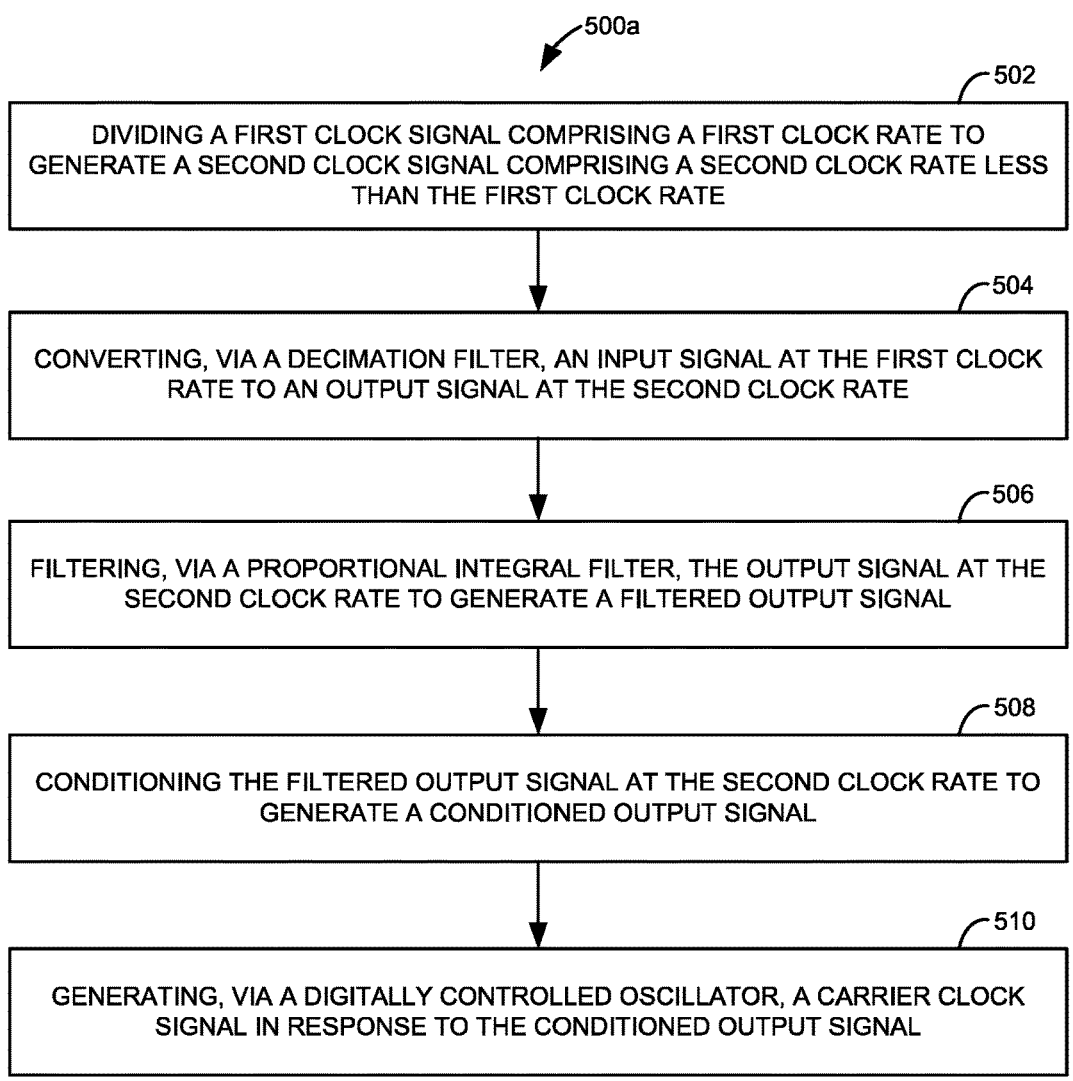
FIGS. 5A-5G are flow diagrams illustrating example methods for generating signals.

FIGS. 5A-5G are flow diagrams illustrating example methods 500a-500g for generating signals. Methods 500a-500g may be implemented by a DPLL (e.g., DPLL 100a of FIG. 1A, DPLL 100b of FIG. 1B, DPLL 200a of FIG. 2A, or DPLL 200b of FIG. 2B), a transceiver (e.g., 300 of FIG. 3A or 350 of FIG. 3B), and/or a system (e.g., 400 of FIG. 4). As illustrated in FIG. 5A at 502, method 500a includes dividing (e.g., via 104 of FIG. 1A or 1B, 204 of FIG. 2A, or 290 of FIG. 2B) a first clock signal (e.g., CKREF of FIG. 1A, 1B, 2A, or 2B) comprising a first clock rate to generate a second clock signal (e.g., CKREF' of FIG. 1A, 1B, or 2A; or the clock signal on signal path 292 of FIG. 2B) comprising a second clock rate less than the first clock rate. At 504, method 500a includes converting, via a decimation filter (e.g., 108 of FIG. 1A or 1B or 208 of FIG. 2A or 2B), an input signal at the first clock rate (e.g., the signal on signal path 134 of FIG. 1A or 1B or the signal on signal path 234 of FIG. 2A or 2B) to an output signal at the second clock rate (e.g., the signal on signal path 136 of FIG. 1A or 1B or the signal on signal path 236 of FIG. 2A or 2B).

At 506, method 500a includes filtering, via a proportional integral filter (e.g., 110 of FIG. 1A or 1B or 210 of FIG. 2A or 2B), the output signal at the second clock rate to generate a filtered output signal (e.g., the signal on signal path 138 of FIG. 1A or 1B or the signal on signal path 238 of FIG. 2A or 2B). At 508, method 500a includes conditioning (e.g., via 112 of FIG. 1A or 1B; 212 and 250 of FIG. 2A; or 280, 284, and 288 of FIG. 2B) the filtered output signal at the second clock rate to generate a conditioned output signal (e.g., the signal on signal path 140 of FIG. 1A or 1B or the signal on signal path 240 of FIG. 2A or 2B). At 510, method 500a includes generating, via a digitally controlled oscillator (e.g., 114 of FIG. 1A or 1B or 214 of FIG. 2A or 2B), a carrier clock signal (e.g., CKO of FIG. 1A, 1B, 2A, or 2B) in response to the conditioned output signal.

Figure 5B:
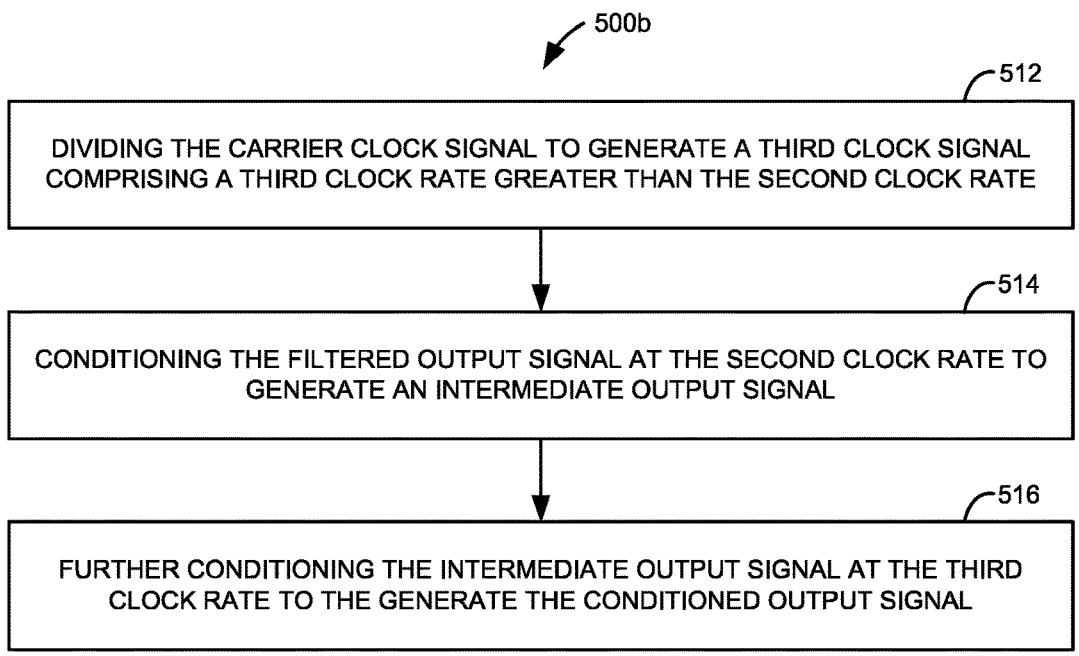

In some examples, method 500a of FIG. 5A may further include method 500b as illustrated in FIG. 5B. At 512, method 500b includes dividing (e.g., via 142 of FIG. 1B, 242 of FIG. 2A, or 242 and/or 290 of FIG. 2B) the carrier clock signal to generate a third clock signal (e.g., CKH of FIG. 1B or 2A, or the signal on signal path 294 of FIG. 2B) comprising a third clock rate greater than the second clock rate. At 514, method 500b may further include conditioning the filtered output signal at the second clock rate (e.g., via the first portion of 112 of FIG. 1B, the first portion of 212 of FIG. 2A, or 280 of FIG. 2B) to generate an intermediate output signal. At 516, method 500b may further include further conditioning (e.g., via the second portion of 112 of FIG. 1B, the second portion of 212 of FIG. 2A, or 284 and 288 of FIG. 2B) the intermediate output signal at the third clock rate to the generate the conditioned output signal.

Figure 5C:
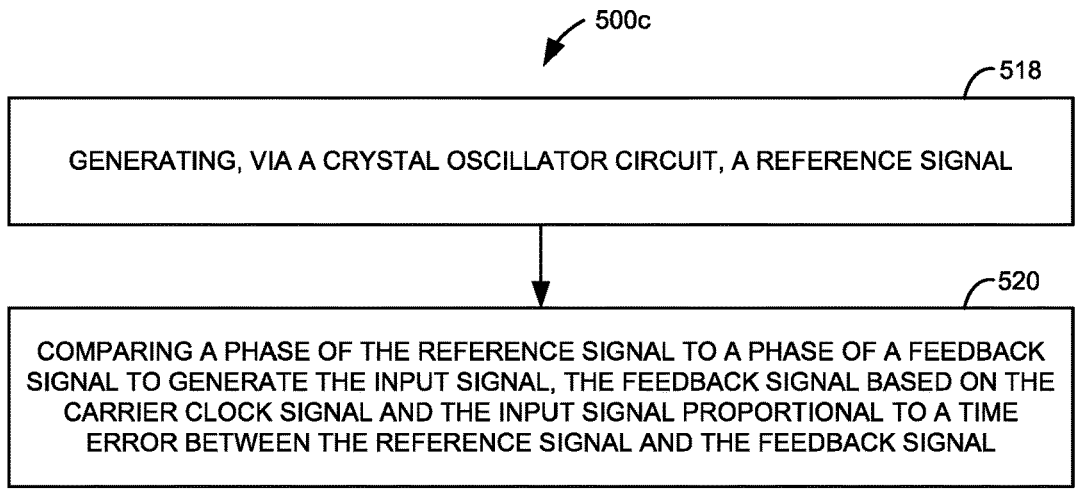

In some examples, method 500a of FIG. 5A may further include method 500c as illustrated in FIG. 5C. At 518, method 500c includes generating, via a crystal oscillator circuit (e.g., 270, 272, and 276 of FIG. 2A or 2B), a reference signal (e.g., REF of FIG. 1A, 1B, 2A, or 2B). At 520, method 500c includes comparing (e.g., via 106 of FIG. 1A or 1B or 206 of FIG. 2A or 2B) a phase of the reference signal to a phase of a feedback signal (e.g., FB of FIG. 1A or 1B or DIV of FIG. 2A or 2B) to generate the input signal, the feedback signal based on the carrier clock signal and the input signal proportional to a time error between the reference signal and the feedback signal.

Figure 5D:
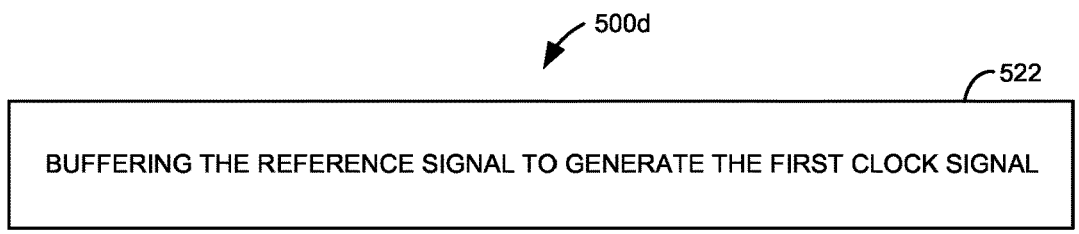

In some examples, method 500c of FIG. 5C may further include method 500d as illustrated in FIG. 5D. At 522, method 500d includes buffering (e.g., via 102 of FIG. 1A or 1B or 202 of FIG. 2A or 2B) the reference signal to generate the first clock signal.

Figure 5E:
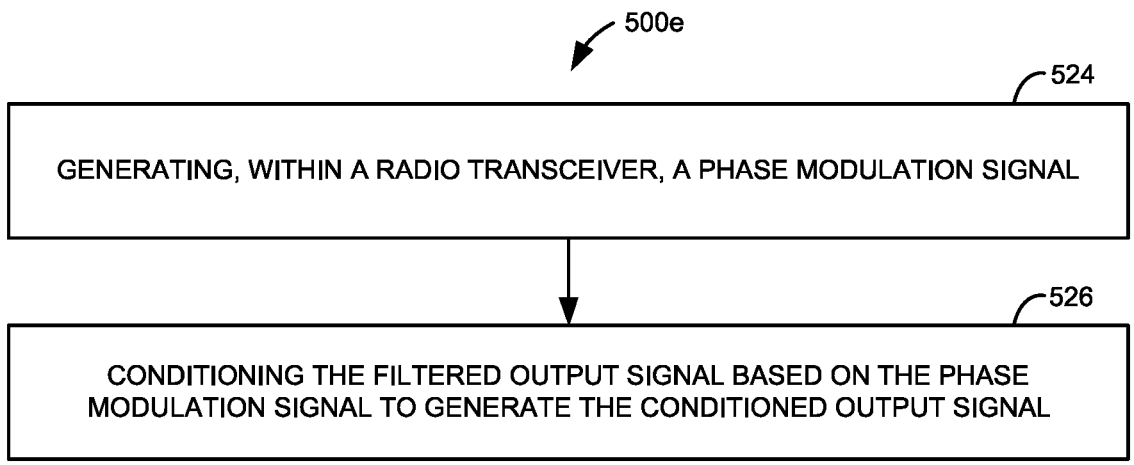

In some examples, method 500c of FIG. 5C may further include method 500e as illustrated in FIG. 5E. At 524, method 500e includes generating (e.g., via 254 of FIG. 2A or 2B, 314 of FIG. 3A, or 362 of FIG. 3B), within a radio transceiver (e.g., 300 of FIG. 3A or 350 of FIG. 3B), a phase modulation signal (e.g., MOD[K] of FIG. 2A or 2B, the signal on signal path 332 of FIG. 3A, or $\phi$ of FIG. 3B). At 526, method 500e includes conditioning (e.g., via 212 of FIG. 2A or 280 of FIG. 2B) the filtered output signal based on the phase modulation signal to generate the conditioned output signal.

Figure 5F:
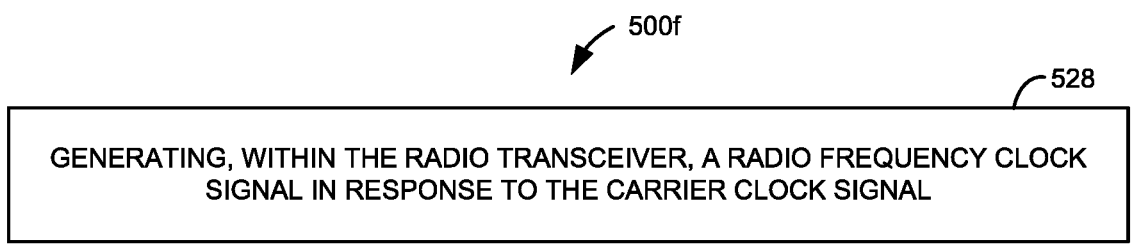

In some examples, method 500e of FIG. 5E may further include method 500f as illustrated in FIG. 5F. At 528, method 500f includes generating (e.g., via 318 of FIG. 3A or 366 of FIG. 3B), within the radio transceiver, a radio frequency clock signal in response to the carrier clock signal.

Figure 5G:
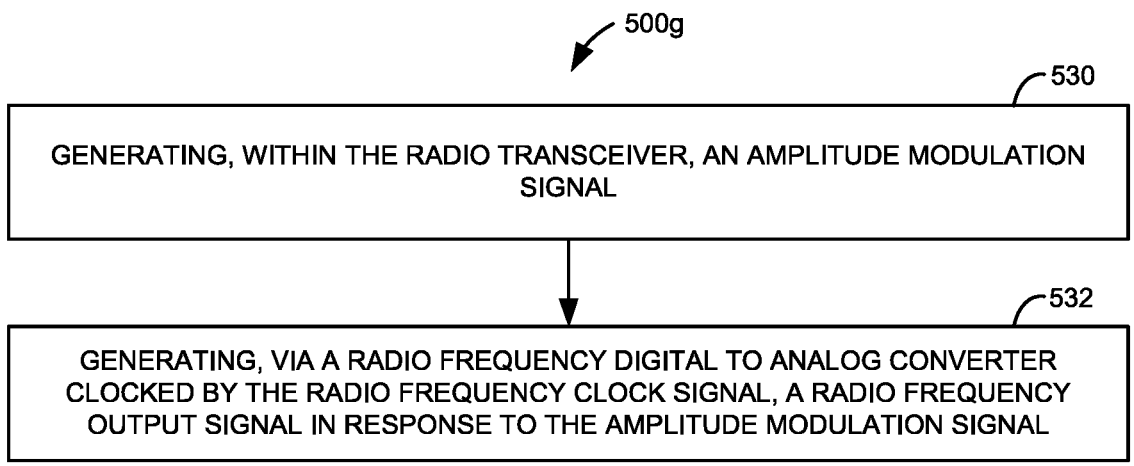

In some examples, method 500*f* of FIG. 5F may further include method 500*g* as illustrated in FIG. 5G. At 530, method 500*g* includes generating (e.g., via 362 of FIG. 3B), within the radio transceiver, an amplitude modulation signal (e.g., A of FIG. 3B). At 532, method 500*g* may further include generating, via a radio frequency digital to analog converter (e.g., 368 of FIG. 3B) clocked by the radio frequency clock signal, a radio frequency output signal in response to the amplitude modulation signal.

It is to be understood that the features of the various exemplary embodiments described herein may be combined with each other, unless specifically noted otherwise.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

What is claimed is:

1. A digital phase-locked loop comprising:
   a first clock divider to divide a first clock signal comprising a first clock rate to generate a second clock signal comprising a second clock rate less than the first clock rate;
   a decimation filter to convert an input signal at the first clock rate to an output signal at the second clock rate;
   a proportional integral filter to filter the output signal at the second clock rate to generate a filtered output signal;
   a signal conditioner to condition the filtered output signal at the second clock rate to generate a conditioned output signal; and
   a digitally controlled oscillator to generate a carrier clock signal in response to the conditioned output signal.

2. The digital phase-locked loop of claim 1, further comprising:
   a second clock divider to divide the carrier clock signal to generate a third clock signal comprising a third clock rate greater than the second clock rate;
   wherein the signal conditioner comprises:
      a first portion to condition the filtered output signal at the second clock rate to generate an intermediate output signal; and
      a second portion to condition the intermediate output signal at the third clock rate to generate the conditioned output signal.

3. The digital phase-locked loop of claim 1, wherein the decimation filter comprises a cascaded integrator comb filter or a polyphase filter.

4. The digital phase-locked loop of claim 1, further comprising:
   a crystal oscillator circuit to generate a reference signal; and
   a time to digital converter to compare a phase of the reference signal to a phase of a feedback signal to generate the input signal, the feedback signal based on the carrier clock signal and the input signal proportional to a time error between the reference signal and the feedback signal.

5. The digital phase-locked loop of claim 4, further comprising:
   a buffer to buffer the reference signal to generate the first clock signal.

6. The digital phase-locked loop of claim 1, further comprising:
   a modulator to generate a modulation signal,
   wherein the signal conditioner conditions the filtered output signal based on the modulation signal to generate the conditioned output signal.

7. The digital phase-locked loop of claim 1, wherein the signal conditioner comprises a predistortion and calibration signal conditioner.

8. The digital phase-locked loop of claim 1, wherein the signal conditioner comprises a delta-sigma modulator.

9. A system comprising:
   a controller;
   a transceiver communicatively coupled to the controller, the transceiver comprising a digital phase-locked loop; and
   at least one antenna electrically coupled to the transceiver,
   wherein the digital phase-locked loop comprises:
      a first clock divider to divide a first clock signal comprising a first clock rate to generate a second clock signal comprising a second clock rate less than the first clock rate;
      a decimation filter to convert an input signal at the first clock rate to an output signal at the second clock rate;
      a proportional integral filter to filter the output signal at the second clock rate to generate a filtered output signal;
      a signal conditioner to condition the filtered output signal at the second clock rate to generate a conditioned output signal; and
      a digitally controlled oscillator to generate a carrier clock signal in response to the conditioned output signal.

10. The system of claim 9, wherein the digital phase-locked loop further comprises:
    a second clock divider to divide the carrier clock signal to generate a third clock signal comprising a third clock rate greater than the second clock rate;
    wherein the signal conditioner comprises:
       a first portion to condition the filtered output signal at the second clock rate to generate an intermediate output signal; and
       a second portion to condition the intermediate output signal at the third clock rate to generate the conditioned output signal.

11. The system of claim 9, further comprising:
    a modulator to generate a modulation signal,
    wherein the signal conditioner conditions the filtered output signal based on the modulation signal to generate the conditioned output signal.

12. The system of claim 9, wherein the transceiver comprises a radar transceiver, a Wi-Fi transceiver, or a Bluetooth transceiver.

13. The system of claim 9, wherein the digital phase-locked loop comprises a feedback divider digital phase-locked loop, a phase domain digital phase-locked loop, or a sub-sampling digital phase-locked loop.

14. A method comprising:
    dividing a first clock signal comprising a first clock rate to generate a second clock signal comprising a second clock rate less than the first clock rate;
    converting, via a decimation filter, an input signal at the first clock rate to an output signal at the second clock rate;
    filtering, via a proportional integral filter, the output signal at the second clock rate to generate a filtered output signal;

conditioning the filtered output signal at the second clock rate to generate a conditioned output signal; and generating, via a digitally controlled oscillator, a carrier clock signal in response to the conditioned output signal.

15. The method of claim 14, further comprising:

dividing the carrier clock signal to generate a third clock signal comprising a third clock rate greater than the second clock rate;

wherein conditioning the filtered output signal comprises:
conditioning the filtered output signal at the second clock rate to generate an intermediate output signal; and
further conditioning the intermediate output signal at the third clock rate to the generate the conditioned output signal.

16. The method of claim 14, further comprising:

generating, via a crystal oscillator circuit, a reference signal; and comparing a phase of the reference signal to a phase of a feedback signal to generate the input signal, the feedback signal based on the carrier clock signal and the input signal proportional to a time error between the reference signal and the feedback signal.

17. The method of claim 16, further comprising:
buffering the reference signal to generate the first clock signal.

18. The method of claim 16, further comprising:

generating, within a radio transceiver, a phase modulation signal;

wherein conditioning the filtered output signal comprises conditioning the filtered output signal based on the phase modulation signal to generate the conditioned output signal.

19. The method of claim 18, further comprising:

generating, within the radio transceiver, a radio frequency clock signal in response to the carrier clock signal.

20. The method of claim 19, further comprising:

generating, within the radio transceiver, an amplitude modulation signal; and generating, via a radio frequency digital to analog converter clocked by the radio frequency clock signal, a radio frequency output signal in response to the amplitude modulation signal.

* * * * *